US009831371B2

(12) United States Patent
Dumont et al.

(10) Patent No.: US 9,831,371 B2
(45) Date of Patent: *Nov. 28, 2017

(54) DEVICE FOR DETECTING RADIATION INCLUDING AN ENCAPSULATING STRUCTURE HAVING AN IMPROVED MECHANICAL STRENGTH

(71) Applicant: Commissariat A L'Energie Atomique et aux Energies Alternatives, Paris (FR)

(72) Inventors: Geoffroy Dumont, Paris (FR); Laurent Carle, Grenoble (FR); Pierre Imperinetti, Seyssins (FR); Stephane Pocas, Grenoble (FR); Jean-Jacques Yon, Sassenage (FR)

(73) Assignee: Commissariat A L'Energie Atomique et aux Engergies Altrnatives, Paris (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/048,177

(22) Filed: Feb. 19, 2016

(65) Prior Publication Data

US 2016/0247955 A1    Aug. 25, 2016

(30) Foreign Application Priority Data

Feb. 20, 2015 (FR) ...................... 15 51491

(51) Int. Cl.
*H01L 31/09* (2006.01)
*G01J 5/04* (2006.01)
(Continued)

(52) U.S. Cl.
CPC ............ *H01L 31/09* (2013.01); *G01J 5/0225* (2013.01); *G01J 5/045* (2013.01); *G01J 5/20* (2013.01);
(Continued)

(58) Field of Classification Search
CPC .............................. H01L 31/024; H01L 31/09
See application file for complete search history.

(56) References Cited

U.S. PATENT DOCUMENTS 6,507,021 B1 * 1/2003 Brood ........................ G01J 5/20
250/338.1
8,895,924 B2 * 11/2014 Dumont ................ B82Y 20/00
250/338.1

(Continued)

FOREIGN PATENT DOCUMENTS

| EP | 1 067 372 A1 | 1/2001 |
| EP | 1 243 903 A2 | 9/2002 |
| EP | 2 587 234 A1 | 5/2013 |

OTHER PUBLICATIONS

French Preliminary Search report dated Jan. 26, 2016 in French Application15 51491, filed on Feb. 20, 2015 ( with English Translation of Categories of Cited Documents and Written opinion).

(Continued)

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

A device for detecting electromagnetic radiation is provided, including a substrate; at least one thermal detector placed on the substrate; and an encapsulating structure encapsulating the detector, including a thin encapsulating layer of a material that is transparent to said radiation, extending around and above the detector so as to define with the substrate a cavity in which the detector is located; wherein the thin encapsulating layer comprises a peripheral wall that encircles the detector, and that has a cross section, in a plane parallel to the plane of the substrate, of square or rectangular shape, corners of which are rounded.

13 Claims, 6 Drawing Sheets

(51) Int. Cl.
  *G01J 5/02* (2006.01)
  *G01J 5/20* (2006.01)
  *H01L 31/0203* (2014.01)
  *H01L 31/0224* (2006.01)
  *H01L 37/00* (2006.01)

(52) U.S. Cl.
  CPC ...... *H01L 31/0203* (2013.01); *H01L 31/0224* (2013.01); *H01L 37/00* (2013.01)

(56) References Cited

U.S. PATENT DOCUMENTS

| 2002/0175284 | A1 | 11/2002 | Vilain |
| 2007/0262473 | A1* | 11/2007 | Yim ..................... H01L 21/565 257/787 |
| 2013/0093037 | A1 | 4/2013 | Kirihara et al. |
| 2016/0245702 | A1* | 8/2016 | Dumont ................... G01J 5/34 |

OTHER PUBLICATIONS

Vincent Beix "Etudes des procedes d'encapsulation hermetique au niveau du substrat par la technologie de transfert de films", https://tel.archives-ouvertes.fr/tel-01037897, 2014, 151 pages.
G. Dumont et al. "Current progress on pixel level packaging for uncooled IRFPA", SPIE 8353-52 V.2, 2012, 8 pages.
Search Report dated Oct. 24, 2016 in European Patent Application No. 16156191.5.
Geoffroy Dumont et al., "Innovative on-chip packaging applied to uncooled IRFPA", Optical Sensing II, vol. 6940, XP055286288, Apr. 3, 2008, 6 pages.

* cited by examiner

DEVICE FOR DETECTING RADIATION INCLUDING AN ENCAPSULATING STRUCTURE HAVING AN IMPROVED MECHANICAL STRENGTH

TECHNICAL FIELD

The field of the invention is that of devices for detecting electromagnetic radiation, and in particular infrared or terahertz radiation, including at least one thermal detector, and preferably a matrix of thermal detectors, and an encapsulating structure that forms at least one hermetic cavity in each of which at least one detector is housed. The invention is especially applicable to the field of infrared imaging and thermography.

STATE OF THE PRIOR ART

A device for detecting electromagnetic radiation, for example infrared or terahertz radiation, conventionally comprises a matrix of what are referred to as elementary thermal detectors, each detector including a section able to absorb the radiation to be detected. With the aim of ensuring the thermal insulation of the thermal detectors, each section conventionally takes the form of a membrane suspended above the substrate and thermally isolated therefrom by thermally insulating holding elements. These holding elements also provide an electrical function as they are used to electrically connect the thermal detectors to a read circuit generally placed in the substrate.

To ensure optimal detector operation, a low pressure level is required. For this reason, the detectors are generally confined, or encapsulated, whether alone or in groups of two or more, in hermetic cavities that are under a vacuum or a low pressure.

FIG. 1 illustrates an exemplary detecting device 1 suitable for detecting infrared radiation, and more precisely one pixel of the detecting device, here formed by a bolometric detector 2 resting on a substrate 3 and placed alone in a hermetic cavity 4, such as described in the publication by Dumont et al., *Current progress on pixel level packaging for uncooled IRFPA*, Proc. SPIE 8353, Infrared Technology and Applications XXXVII, 83531I 2012.

In this example, the detecting device 1 includes an encapsulating structure 5, also called a capsule, that defines the cavity 4 in which the bolometric detector 2 is located. The encapsulating structure 5 includes a thin encapsulating layer 6 that defines with the substrate 3 the cavity 4, and a thin sealing layer 7 that covers the thin encapsulating layer 6 and ensures the hermeticity of the cavity 4. The encapsulating 6 and sealing 7 layers are transparent to the electromagnetic radiation to be detected.

The detecting device 1 is produced using techniques for depositing thin layers and especially sacrificial layers. During the production process, the sacrificial layers are stripped and removed from the cavity through one or more exhaust vents 8 provided in the thin encapsulating layer 6. The sealing layer 7 is used, after the sacrificial layers have been removed and the cavity 4 placed under vacuum, to block the exhaust vents 8.

With the aim of maximising the fill factor, i.e. the ratio of the area of the absorbing membrane to the total area of the pixel, in the plane of the substrate, it is desired to decrease as much as possible the spacing between the detectors and the border of the capsules, and the spacing between the capsules in the case where the device provides for a plurality of capsules. To do this, the optimal shape of the capsules, in a plane parallel to the plane of the substrate, is a square or rectangular shape the corners of which are right angles. However, the mechanical strength of the capsules remains to be improved. Specifically, a failure in the mechanical strength of a capsule leads to breakage of the hermeticity of the cavity and therefore possibly to the functional loss of the detector, or even of the matrix of detectors.

SUMMARY OF THE INVENTION

The aim of the invention is to at least partially remedy the drawbacks of the prior art, and more particularly to provide a device for detecting electromagnetic, for example infrared or terahertz, radiation including at least one thermal detector placed in a hermetic cavity formed by an encapsulating structure, the mechanical strength of which is reinforced.

For this purpose, the invention provides a device for detecting electromagnetic radiation, comprising: a substrate; at least one thermal detector placed on the substrate; and an encapsulating structure encapsulating the thermal detector, including a thin encapsulating layer extending around and above the thermal detector so as to define with the substrate a cavity in which the thermal detector is located, said thin encapsulating layer being produced from a material that is transparent to said electromagnetic radiation.

According to the invention, the thin encapsulating layer comprises a peripheral wall that encircles the thermal detector, and that has a cross section, in a plane parallel to the plane of the substrate, of square or rectangular shape the corners of which are rounded.

The peripheral wall may include a rounded section and two rectilinear sections extending along axes that are substantially orthogonal to each other, said rectilinear sections being connected to each other by the rounded section, the rounded section having a radius of curvature larger than or equal to two times the thickness of one of the rectilinear sections.

The radius of curvature of the rounded section may be measured from the internal surface, i.e. that oriented towards the cavity, of the rounded section.

The thin encapsulating layer may include at least one through-orifice that is what is referred to as an exhaust vent, said encapsulating structure furthermore including a sealing layer covering the thin encapsulating layer so as to make the cavity hermetic, i.e. the sealing layer hermetically plugs the exhaust vent.

The device may include a matrix of detectors placed in one and the same cavity, the thin encapsulating layer furthermore comprising at least one section, which is what is referred to as an internal bearing section, located between two adjacent thermal detectors, and which bears directly against the substrate.

The internal bearing section may have a profile, in a plane parallel to the plane of the substrate of oblong shape, preferably with rounded longitudinal ends.

The internal bearing section may include a sidewall and a bottom portion, said sidewall extending substantially vertically over the entire height of the cavity and the bottom portion making contact with the substrate.

The thin encapsulating layer may include at least one through-orifice that is what is referred to as an exhaust vent, having a transverse profile, in a plane orthogonal to the plane of the substrate, the width of which increases with distance from the substrate. The encapsulating structure may furthermore include a sealing layer covering the thin encapsulating layer so as to make the cavity hermetic, the sealing layer including a border that extends in the direction of the thickness of the sealing layer, from the border of the exhaust vent, with a non-zero angle α relative to an axis substantially orthogonal to the plane of the substrate, and in which the transverse profile of the exhaust vent makes an angle β to the same orthogonal axis larger than the angle α.

The detecting device may include a matrix of thermal detectors, each detector including a membrane suitable for absorbing the radiation to be detected, which membrane is suspended above the substrate and thermally insulated therefrom by anchoring pins and thermally insulating arms, the thin encapsulating layer including a plurality of through-orifices that are what are referred to as exhaust vents placed so that at least some of said thermal detectors each have a single exhaust vent located facing the corresponding absorbing membrane, preferably plumb with the centre of said membrane. In other words, the single vent is located plumb with the absorbing membrane, i.e. perpendicular to the absorbing membrane. The single vent is therefore not located facing anchoring pins or thermally insulating arms.

Each absorbing membrane may include a through-orifice facing the corresponding exhaust vent, of larger or equal size to that of said vent. In other words, said absorbing membrane, facing which is located an exhaust vent, may include a through-orifice located plumb with said exhaust vent and of larger or equal size to that of said vent.

The suspended membrane may include a stack of a bolometric layer, a dielectric layer that is structured so as to form two separate sections, and an electrically conductive layer that is structured so as to form three electrodes, two of said electrodes, which are intended to be raised to the same electrical potential, flanking the third electrode, which is what is referred to as the central electrode and which is intended to be raised to a different electrical potential, each electrode making contact with the bolometric layer, the central electrode being electrically insulated from the other electrodes by the dielectric layer, the through-orifice passing through the central electrode and the bolometric layer in a zone located between the sections of the dielectric layer.

The encapsulating structure may furthermore include a sealing layer covering the thin encapsulating layer so as to make the cavity hermetic, and in which the substrate comprises a tie layer placed facing the through-orifice of the corresponding membrane and suitable for ensuring the adhesion of the material of the sealing layer.

The tie layer may extend under the whole of the corresponding membrane and may be furthermore made of a material suitable for reflecting the electromagnetic radiation to be detected.

The invention also relates to a process for producing a detecting device having any one of the above features, in which the thin encapsulating layer is placed on a sacrificial layer, the latter then being removed and extracted through at least one exhaust vent in the thin encapsulating layer.

BRIEF DESCRIPTION OF THE DRAWINGS

Other aspects, aims, advantages and features of the invention will become more clearly apparent on reading the following detailed description of preferred embodiments thereof, this description being given by way of nonlimiting example and with reference to the appended drawings in which.

DETAILED DESCRIPTION OF PARTICULAR EMBODIMENTS

In the figures and in the rest of the description, references that are the same represent identical or similar elements.

Figure 1:
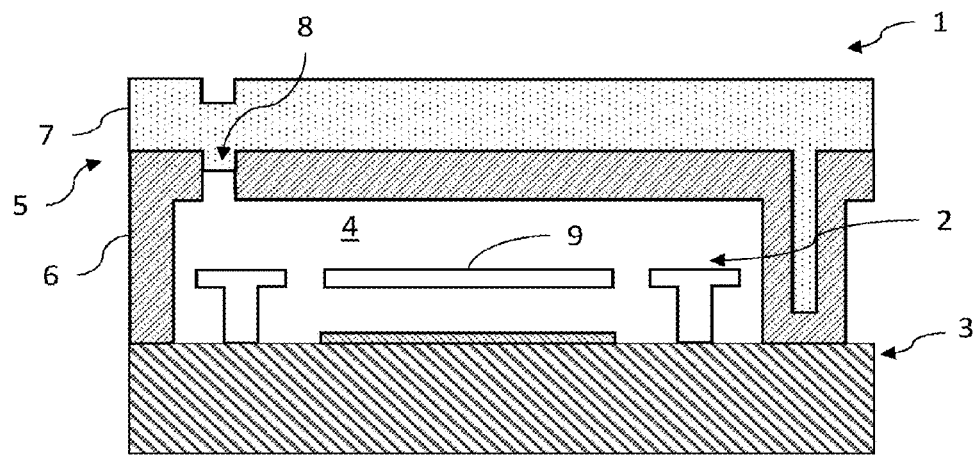
FIG. 1, described above with reference to an example of the prior art, is a schematic cross-sectional view of a detecting device according to one embodiment.

FIG. 1, which was incompletely described above with reference to an example of the prior art, here illustrates an exemplary device for detecting electromagnetic radiation according to one embodiment.

In this example, the device 1 for detecting electromagnetic radiation is suitable for detecting infrared or terahertz radiation. It includes a matrix of thermal detectors 2 that are what are referred to as elementary detectors. FIG. 1 is a partial view of the detecting device and shows only a single detector placed in a cavity.

It comprises a substrate 3, for example made of silicon, comprising a read circuit (not shown) for example produced in CMOS technology, allowing the biases required to operate the detectors and read the information issued therefrom to be applied.

The thermal detector 2 comprises a section suitable for absorbing the radiation to be detected. This absorbing section is generally thermally insulated from the substrate and may be placed on a membrane 9, which is what is referred to as an absorbing membrane, suspended above the substrate 3 by thermally insulating holding elements 11 such as anchoring pins 11a associated with thermally insulating arms 11b. The membrane 9 is spaced apart from the substrate 3 by a distance typically comprised between 1 μm and 5 μm, and preferably 2 μm when the detector is designed to detect infrared radiation the wavelength of which is comprised between 8 μm and 14 μm.

In the rest of the description, the thermal detectors 2 are bolometers the absorbing membrane 9 of which includes a thermistor material the electrical conductivity of which varies as a function of the temperature of the membrane.

However, this example is given by way of illustration and is nonlimiting. Any other type of thermal detector may be used, for example ferroelectric or pyroelectric detectors or even thermopiles.

In one example detailed below with reference to FIG. 5, the detectors 2, which are placed in one and the same cavity, may be arranged close together, especially by connecting the thermally insulating arms 11b of various thermal detectors to a given anchoring pin 11a, the read architecture of the thermal detectors then being adapted, as documents EP1106980 and EP1359400 describe. An improvement in the sensitivity of the detectors 2 results due to the increased length of the insulating arms 11b and the increase in the fill factor achieved by decreasing the area of each pixel not dedicated to the absorption of electromagnetic radiation. The detecting device is thus particularly appropriate for small matrix pitches, for example between 25 µm and 17 µm, or even 12 µm.

The detecting device 1 includes an encapsulating structure 5, or capsule, that defines, with the substrate 3, a hermetic cavity 4 inside of which the thermal detector 2 is placed. The encapsulating structure 5 is formed from a thin encapsulating layer 6 that is deposited so that it has a peripheral wall 6a that encircles the detector 2 and a top wall 6b that extends over the detector 2. The top wall 6b is substantially planar and extends over the suspended membrane 9 at a distance therefrom for example comprised between 0.5 µm and 5 µm, preferably 1.5 µm.

The encapsulating layer 6 is a thin layer in that it has a thickness smaller than a few tens of microns, for example than 10 µm, and in that it is produced by layer deposition techniques conventionally used in microelectronics and especially conformal deposition techniques such as CVD (Chemical Vapour Deposition) or iPVD (Ionised Physical Vapour Deposition).

Moreover, the encapsulating layer 6 is produced from a material that is transparent to the electromagnetic radiation to be detected. By transparent material, what is meant is a material the factor of transmission of the radiation to be detected of which is higher than 20%, preferably than 50%, preferably than 80% and more preferably than 90%. In the case of infrared radiation, for example in the wavelength range comprised between 8 µm and 14 µm, an exemplary transparent material is silicon, germanium or silicon-germanium SiGe, for example amorphous silicon, the transmission factor of which is here higher than 95%.

As described below, the encapsulating layer 6 is preferably produced using a freed layer technique, in so far as it is deposited on a sacrificial layer that covers the detector, the latter then being removed and extracted through at least one through-orifice in the encapsulating layer, this orifice being what is referred to as an exhaust vent. This production technique in particular differs from what are referred to as transferred layer techniques, in which the thin encapsulating layer is produced on a structured substrate separate from the substrate 3, then added to and assembled with the substrate 3.

Figure 2:
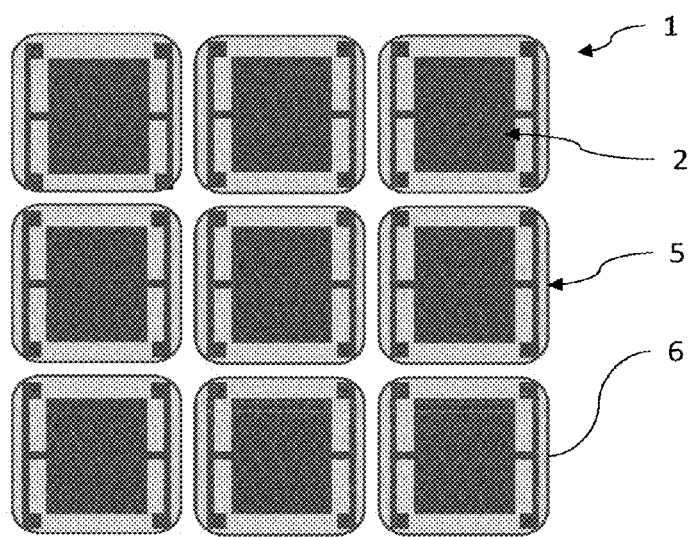
FIG. 2 is a schematic representation of a top view of a detecting device according to one embodiment, comprising a matrix of detectors in which each detector is housed in a separate cavity, the cavities having a shape with rounded corners.

FIG. 2 is a schematic representation of a top view of a matrix of detectors 2 in which each detector is placed in a separate hermetic cavity from its neighbours. The thin encapsulating layer 6 is deposited so as to extend around and over each detector. Thus, a plurality of capsules 5 is formed. Each capsule here has a cross section, in a plane parallel to the plane of the substrate, of square or rectangular shape with rounded corners.

The inventors have observed that the production of rounded sections at the corners of the capsule improves the adherence of the latter to the substrate. Specifically, it has been observed that the adherence of the capsule is not uniform along the peripheral wall and that the corners of the capsule have a reinforced adherence when rounded sections are produced.

Figure 3:
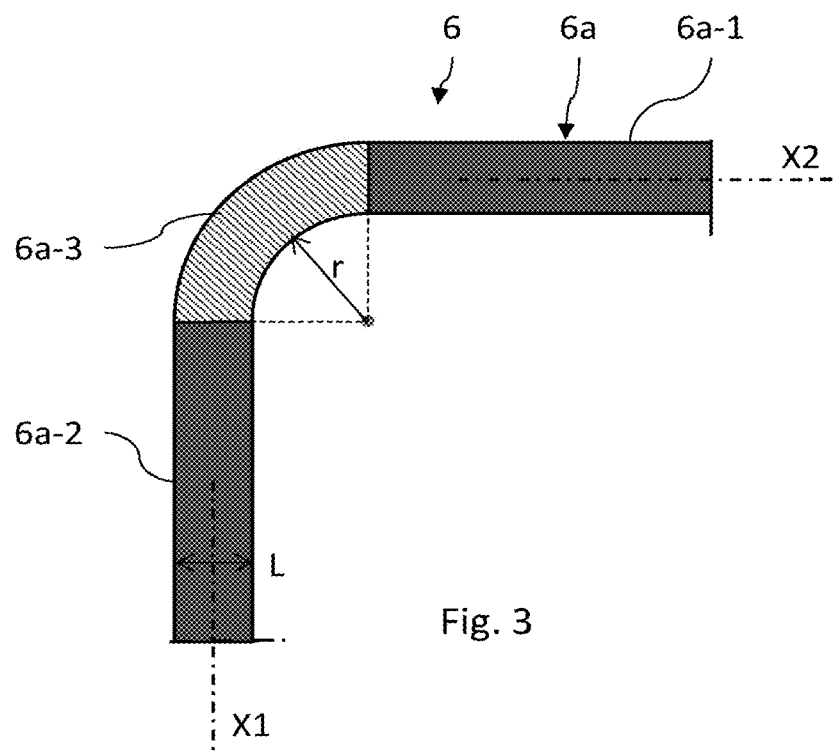
FIGS. 3 and 4 are partial schematic representations of top views of the peripheral wall of the thin encapsulating layer according to one embodiment, in which the wall includes, at the corners of the cavity, a rounded section.
Figure 4:
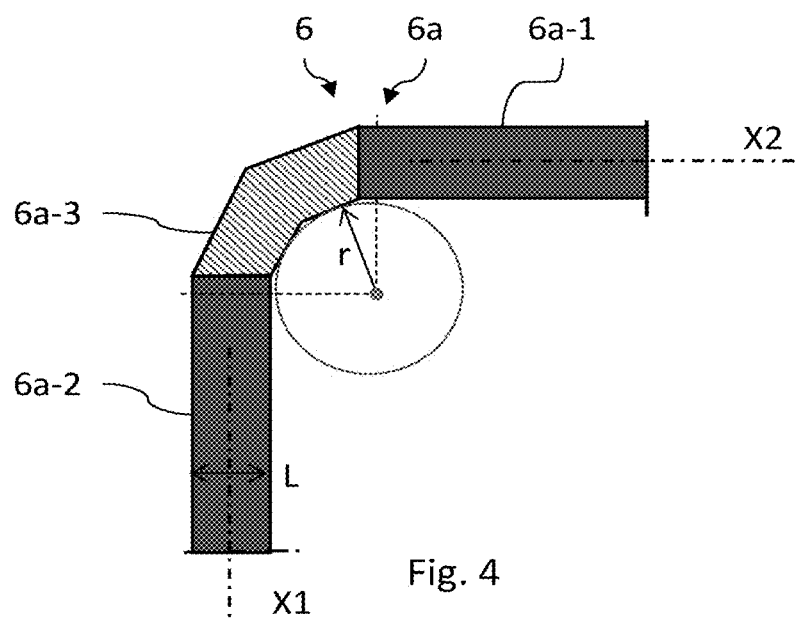

As FIGS. 3 and 4 show, the peripheral wall 6a of the thin encapsulating layer 6 is formed, at each corner of the capsule, from two sections 6a-1, 6a-2 extending substantially rectilinearly, each along an axis X1, X2 that is substantially orthogonal to the other. The rectilinear sections 6a-1 and 6a-2 do not join at a right angle but are connected to each other by a rounded section 6a-3.

By rounded section, what is meant is a section having at least one curved and for example circular or elliptical segment, or at least one right segment, and preferably a plurality of right segments, extending along an axis that is not colinear with the respective axis of the rectilinear sections.

FIG. 3 shows an example of a rounded section 6a-3 taking the form of a circular arc segment connecting the rectilinear sections 6a-1 and 6a-2. The radius of this circular arc, measured from the external surface of the rounded section 6a-3, i.e. the surface oriented towards the exterior of the cavity (escribed circle), may be larger than or equal to two times the width L of the peripheral wall. Preferably, the dimensions of the rounded section are such that the radius of an inscribed circle, i.e. a circle tangent to the internal surface of the rounded section is larger than or equal to two times the width L.

The width L is defined as the average width of a substantially rectilinear section 6a-1, 6a-2 of the peripheral wall 6a. The rounded section 6a-3 preferably has a width substantially equal to that of the rectilinear sections.

FIG. 4 shows another example of a rounded section, as a variant to that in FIG. 3. In this example, the rounded section 6a-3 is formed by a succession of two right segments that are inclined one relative to the other. It is possible to define an escribed circle, tangent to the external surface of each segment. The orientation of the segments may be such that the radius of the escribed circle is larger than or equal to two times the width L of the peripheral wall. Preferably, the orientation of the segments is such that the radius of an inscribed circle, i.e. a circle tangent to the internal surface of the segments, is larger than or equal to two times the width L.

By way of example, the width L of the peripheral wall of the thin encapsulating layer may be comprised between about 200 nm and 2 µm. The radius of the inscribed or escribed circle is larger than or equal to a value comprised between 400 nm and 4 µm depending on the width L, for example 2 µm in the case of a width L equal to 800 nm.

Figure 5:
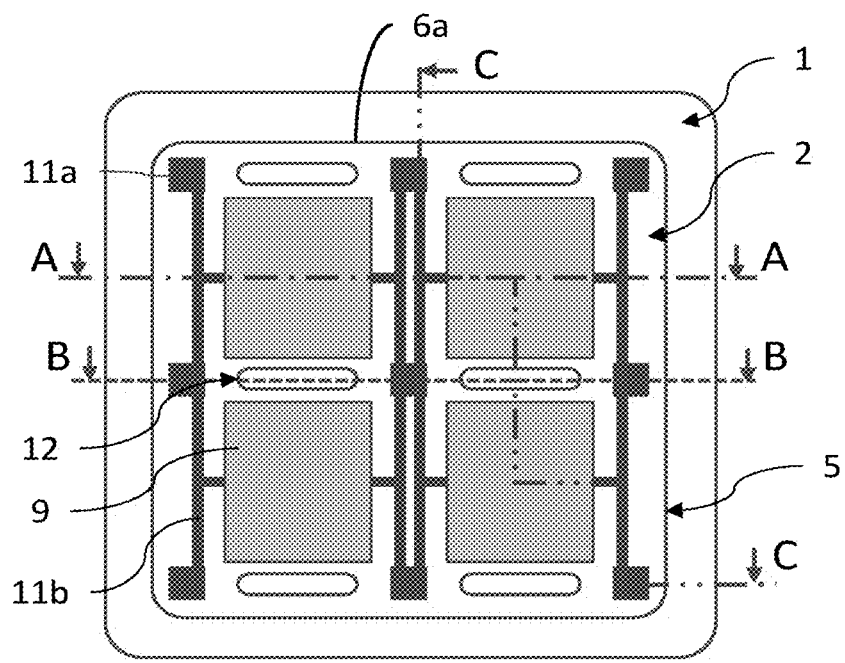
FIG. 5 is a schematic representation of a top view of a detecting device according to one embodiment, in which a matrix of detectors is housed in one and the same cavity.
Figure 6:
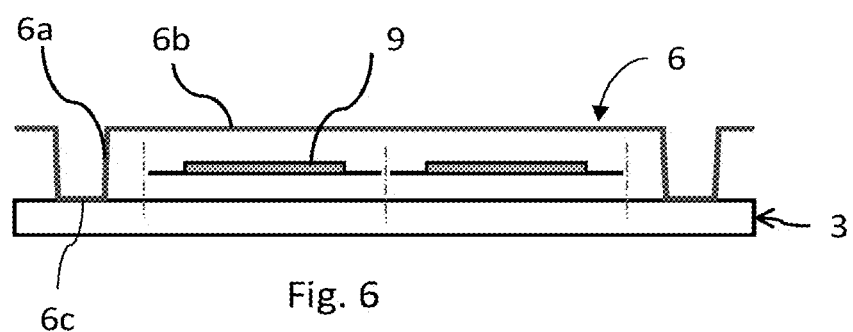
FIG. 6 is a cross-sectional schematic view in the plane A-A of the detecting device shown in FIG. 5.
Figure 7:
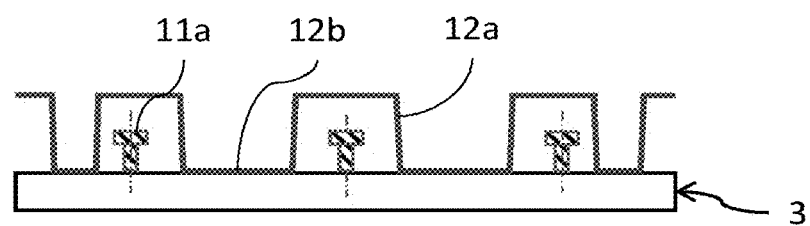
FIG. 7 is a cross-sectional schematic view in the plane B-B of the detecting device shown in FIG. 5.

According to one embodiment, shown in FIGS. 5 to 7, the detecting device includes a detector matrix 2 housed in one and the same hermetic cavity with rounded corners. The encapsulating structure 5 includes at least one internal bearing section 12 located between two adjacent detectors 2, and preferably a plurality of internal bearing sections. Certain internal bearing sections may furthermore be placed on the periphery of the matrix of detectors 2, bordering the cavity 4. The internal bearing sections 12 are formed by the thin encapsulating layer 6, which thus includes continuously the peripheral wall 6a, the top wall 6b and the internal bearing sections 12.

The internal bearing sections 12 rest (or bear) directly on (or against) the substrate 3. In other words, they make direct contact with the substrate. These internal bearing sections 12 thus allow the mechanical strength of the capsule 5 to be reinforced. The adherence of the capsule 5 to the substrate 3 is thus ensured on the one hand by a bottom portion of the peripheral wall 6a of the thin encapsulating layer 6, which rests on the substrate on the periphery of the cavity, and on the other hand by the one or more internal bearing sections 12 placed in the cavity.

This multiplicity of contact areas, distributed bordering the cavity and inside thereof, makes it possible to increase the mechanical strength of the capsule. In addition, in so far as the capsule also has rounded corners, the overall adherence of the capsule to the substrate is particularly reinforced, by virtue of the synergistic effect between the multiplicity of bearing areas deposited in the cavity and the local reinforcement of the adherence at the corners of the cavity.

By resting directly on or bearing directly against the substrate, what is meant is that the internal bearing sections 12 make direct contact with the substrate 3, independently of whether this is with the material making up the substrate or with a thin layer, for example a passivating layer or a tie layer, deposited on the surface of the substrate, and independently of whether these thin layers extend continuously or not. The internal bearing sections therefore do not rest on the substrate via three-dimensional elements such as the elements holding the suspended membranes.

Specifically, the inventors have observed that, when the bearing sections of the thin encapsulating layer rest, not on the substrate, but on the elements holding the suspended membranes and more precisely on the anchoring pins, problems arise with adhesion of the capsule to the substrate, which may lead to debonding or even destruction of the capsule. Specifically, it appears that the anchoring pins provide a contact area and planarity that are insufficient to ensure a good adhesion of the bearing sections of the thin encapsulating layer. The detecting device according to the invention thus decreases the risk of the capsule debonding, this risk being related to mechanical stresses in the thin layers of the capsule, whether it be a question of stresses that are intrinsic to said thin layers or extrinsic stresses resulting from differential thermal expansion of the capsule with respect to the substrate.

Thus, the encapsulating structure 5 defines a hermetic cavity 4 that houses the matrix of thermal detectors 2, this cavity 4 taking the form of a network of intercommunicating sub-cavities, or cells, that each house a thermal detector subassembly. The cells are separated from each other by the internal bearing sections. As explained above, this network of cells is delimited by one and the same thin encapsulating layer 6, which extends continuously so as to form the peripheral wall 6a and top wall 6b of the cavity 4 and the internal bearing sections 12.

Thus, the device 1 for detecting radiation includes a hermetic cavity 4 that houses a plurality of thermal detectors 2, the mechanical strength of the cavity being reinforced by the presence of the one or more internal bearing sections 12 that rest directly on the substrate 3. Housing a plurality of thermal detectors 2 in the cavity allows the fill factor to be increased, for example by decreasing the matrix pitch or by increasing the size of the absorbing membranes 9, or even by mutualising the anchoring pins 11a. Moreover, parasitic electrical coupling between detectors 2 is avoided in so far as the internal bearing sections 12 do not make contact with the anchoring pins. This device furthermore allows the length of the thermally insulating arms 11b to be increased in order to improve the thermal insulation of the absorbing membranes 9.

FIG. 6 is a cross-sectional view in the plane A-A of the detecting device 1 shown in FIG. 5. It shows in greater detail the thin encapsulating layer 6 extending continuously around and above the matrix of detectors 2 so as to form the cavity 4. The peripheral wall 6a forms the border of the cavity and the top wall 6b extends above the detectors 2. The peripheral wall 6a has a peripheral bottom portion 6c that bears (or rests) directly against (or on) the substrate, so as to ensure adhesion of the capsule to the substrate.

FIG. 7 is a cross-sectional view in the plane B-B of the detecting device 1 shown in FIG. 3. In this figure, the internal bearing sections 12 each comprise a peripheral sidewall 12a and a bottom portion 12b, and bear directly against the substrate 3 via the bottom wall 12b. In other words, each internal bearing section 12 makes contact directly with the substrate 3, whether this be with the constituent material of the substrate 3 or, as mentioned above, with a thin layer deposited on the surface of the substrate.

As shown in FIG. 5, the internal bearing sections 12 may have a profile, in the plane of the substrate, of oblong, i.e. elongate, shape. They may each be placed between two adjacent suspended membranes and two neighbouring anchoring pins, so as to optimise the fill factor. The ends of the oblong profile of the internal bearing sections 12 may be rounded, so as to strengthen the adherence of the latter to the substrate 3 by improved distribution of mechanical stresses. The width of the internal bearing sections may be smaller than 1.5 µm and for example comprised between 0.5 µm and 0.8 µm, and their length may be adjusted depending on the space available between the detectors and especially the anchoring pins.

In the example in FIG. 5, the thermally insulating arms 11b mainly extend along a first axis here perpendicular to the cross-sectional plane B-B, and the internal bearing sections 12 of the capsule 5 extend along a second axis orthogonal to the first axis, here colinear with the cross-sectional plane A-A, between two adjacent membranes 9 and two neighbouring anchoring pins 11a. The width and length of the internal bearing sections may be optimised by taking advantage of the area left free in this zone by the absence of thermally insulating arms. The area of the internal bearing sections making contact with the substrate may thus be large, thereby improving the adherence and mechanical strength of the capsule.

Figure 8:
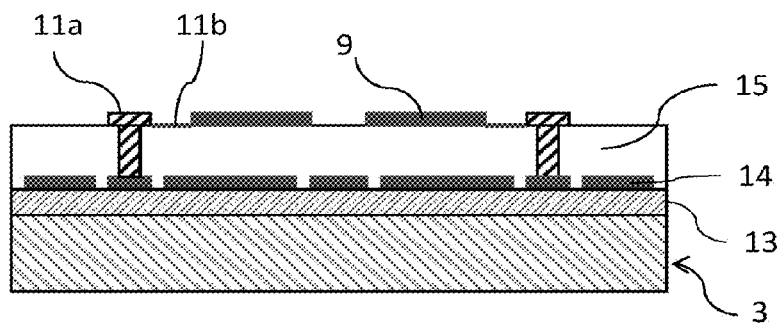
FIGS. 8 to 10 are cross-sectional schematic views of a detecting device according to one embodiment, at various stages of its production process.
Figure 9:
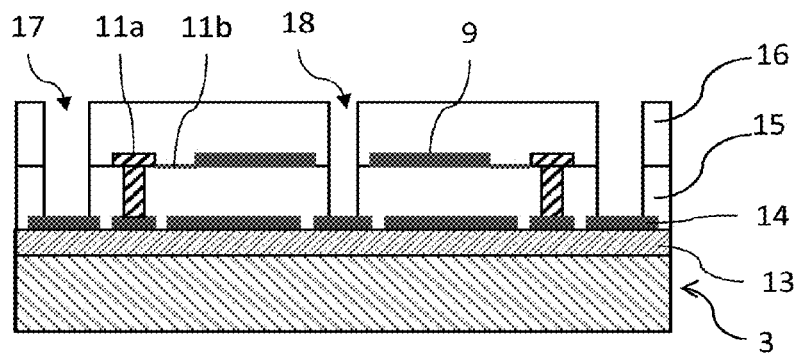
Figure 10:
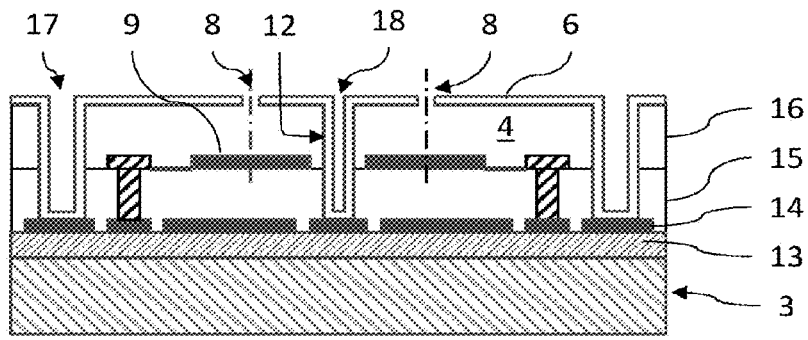

An exemplary production process is now detailed, with reference to FIGS. 8 to 10, which are cross-sectional views, along the axis C-C, of the detecting device shown in FIG. 5.

The detecting device 1 comprises a substrate 3 in which a circuit for reading and controlling the thermal detectors 2 is provided. The substrate 3 may comprise a passivating layer 13, for example made of silicon oxide SiO or silicon nitride SiN. According to one embodiment that is detailed below, the substrate 3 may also comprise an optionally continuous tie layer 14 deposited on the passivating layer 13. The tie layer 14 may be made from titanium or chromium, and have a thickness for example comprised between about 100 nm and 300 nm.

As is known per se, a first sacrificial layer 15 is deposited and the anchoring pins 11a, the thermally insulating arms 11b and the absorbing membranes 9 are produced in and on this sacrificial layer 15. The sacrificial layer may be made from polyimide or even an inorganic material such as silicon oxide, polysilicon or amorphous silicon.

As illustrated in FIG. 9, a second sacrificial layer 16 is then deposited on the first sacrificial layer 15, anchoring elements 11a, thermally insulating elements 11b and absorbing membranes 9. This layer is preferably made of the same material as that of the first sacrificial layer 15 and has a thickness for example comprised between 0.5 μm and 5 μm.

Steps of photolithography and etching, for example RIE etching, are carried out so as to form, preferably during a sequence of common steps, trenches 17, 18 right through the thickness of the sacrificial layers, i.e. as far as the substrate 3 and, more precisely, here as far as the tie layer 14. A first trench 17 is produced so as to extend continuously around the matrix of detectors 2 and is intended for the subsequent production of the peripheral wall of the encapsulating structure. The trench 17 is produced so that the final shape of the capsule, in a plane parallel to the plane of the substrate, has a square or rectangular shape with rounded corners.

At least one and preferably a plurality of second trenches 18, are produced between two adjacent detectors 2 with the aim of forming subsequently the internal bearing section(s). The first and second trenches 17, 18 have a substantially identical depth, so that the peripheral wall of the encapsulating structure and the sidewalls of the bearing sections have in fine a substantially identical height. The process is thus simplified, especially as regards the control of the etch depth.

In the case where the sacrificial layers 15, 16 are made of polyimide, the process for producing the trenches may involve depositing an inorganic protective layer (not shown), for example made of SiN or SiO, or even of amorphous silicon, on the surface of the second sacrificial layer 16. A photolithography step then allows apertures to be defined in a resist layer in the locations where the etching of the trenches is to be carried out. The etching of the trenches is then carried out in 2 steps, a first step in which the protective layer is etched, for example by RIE etching, plumb with the apertures in the resist, and a second step in which the first and second sacrificial layers are etched, for example by RIE etching, as far as the substrate, plumb with the apertures obtained in the protective layer in the first etching step. At this stage, the protective layer may be removed.

This sequence of steps is justified by constraints on the chemical compatibility of the layers present and by geometric constraints (aspect ratio of the trenches). Specifically, the resist layer would disappear in the second step of etching of the polyimide as these layers are all of organic nature, and therefore similarly sensitive to the etching chemistry implemented in the second step. The aperture in the protective layer is then used as a relay to continue to limit the etching to the zones in which it is desired to produce the trenches. The process of the second etching step is moreover adapted to guarantee a high etching anisotropy, thereby allowing high aspect ratios and vertical sidewalls (orthogonal to the plane of the substrate) to be obtained without undercutting. It is furthermore adapted to guarantee a high selectivity on the one hand over the protective layer (made of SiN or SiO) and on the other hand over the surface of the substrate, generally covered with an insulating passivating layer made of SiO or SiN. This high selectivity is advantageous because it allows the thickness of the protective layer to be decreased (typically to 30 nm), this being of a nature to facilitate its subsequent removal.

The trenches 17, 18, and especially the second trenches 18 intended for production of the internal bearing sections, have a high aspect ratio. By way of example, trenches of width smaller than or equal to 1.5 μm, for example comprised between 0.5 μm and 0.8 μm, may be produced in a polyimide layer of thickness comprised between 2 μm and 6 μm, 4 μm for example. The length of the second trenches 18 may be adapted depending on constraints on the compact integration and robustness of the capsule, and may be about a few microns to a few millimeters. These trench dimensions make it possible to produce a matrix of thermal detectors having a particularly small matrix pitch, for example 17 μm or even 12 μm.

The tie layer 14 is preferably made from a material over which the etching of the trenches is selective, so as to avoid any etching of the substrate. The material may be titanium or chromium and the tie layer may have a thickness of about 100 nm to 300 nm.

As shown in FIG. 10, a thin encapsulating layer 6, which is transparent to the radiation to be detected, is then deposited using a conformal deposition technique suitable for obtaining a good coverage of the vertical flanks of the trenches 17, 18, with a substantially constant layer thickness. It may for example be a question of an amorphous silicon layer, a germanium or silicon-germanium layer, produced by CVD or by iPVD, of a thickness typically comprised between about 200 nm and 2000 nm when it is measured on a flat surface. The deposition of the thin encapsulating layer 6 on a surface structured with trenches including at least one continuous peripheral trench 17 (closed perimeter of square or rectangular shape, with rounded corners) leads to the formation of the capsule 5, produced with the material of the thin encapsulating layer and forming, making contact with the substrate 3, a cavity 4 in which the matrix of detectors is housed. The coverage of the flanks of the internal trenches 18 by the thin encapsulating layer 6 allows the shape of the internal trenches to be reproduced in order to form internal bearing sections 12, preferably of oblong shape with rounded edges. It will be noted that these internal bearing sections 12 may be solid or hollow (made up of two spaced-apart walls) depending on whether the width of the internal trenches 18 is small or large relative to the thickness of the thin encapsulating layer 6, respectively.

Through-orifices, forming exhaust vents 8 intended to allow the removal of the sacrificial layers 15, 16 from the cavity, are then produced by photolithography and etching in the thin encapsulating layer 6. Each vent 8 may be square, rectangular, circular, or even oblong in shape.

Next, the sacrificial layers 15, 16 are removed by preferably gas-phase or vapour-phase (depending on the nature of the sacrificial layers) chemical attack (gas-phase attack is used in the polyimide case described here), so as to form the cavity 4 housing the matrix of detectors 2, and the internal bearing sections 12.

A sealing layer (not shown in FIG. 10) is then deposited on the thin encapsulating layer 6 with a sufficient thickness to ensure the exhaust vents 8 are sealed or blocked. The sealing layer is transparent to the electromagnetic radiation to be detected and may have an antireflection function in order to optimise the transmission of radiation through the encapsulating structure. In this respect, it may be formed from sublayers of germanium and zinc sulphide in the case where the radiation to be detected lies in the wavelength range extending from 8 μm to 12 μm, for example a first sublayer of germanium of about 1.7 μm thickness then a second sub-layer of zinc sulphide of about 1.2 μm thickness. The sealing layer is preferably deposited by a vacuum thin-film deposition technique such as electron-beam vacuum evaporation (EBPVD) or such as ion beam or cathode sputtering. Thus a hermetic cavity 4 under vacuum or low pressure is obtained in which the matrix of thermal detectors 2 is housed.

According to another embodiment (not shown), which differs from the example in FIG. 5 in which only a single internal bearing section 12 is produced between two adjacent detectors 2, in that a plurality of internal bearing sections, here two internal bearing sections of oblong profile, extend longitudinally along the same axis, and are located between two adjacent detectors 2. As in the example in FIG. 5, the longitudinal axis of the internal bearing sections 12 may be substantially perpendicular to the axis along which the insulating arms 11b mainly extend. Increasing the number of internal bearing sections 12 allows the adherence of the capsule 5 to the substrate 3 to be reinforced and thus the mechanical strength of said capsule to be reinforced.

According to another embodiment (not shown) each detector 2 may be connected to four anchoring pins 11a certain of which are common to two directly neighbouring detectors located in the same column (or in the same row). This architecture both allows the mechanical strength of the suspended membranes 9 to be improved and permits the matrix of detectors to be read sequentially row by row (or column by column, respectively) as it is conventional to do using reading means located, at the end of the column (at the end of the row, respectively), in a read circuit produced in the substrate of the device. The sensitivity of the detectors is improved with this shared anchoring pin architecture as the length of the thermally insulating arms 11b may be increased, and the fill factor is improved by the mutualisation of the anchoring points 11a, which do not contribute to the capture of the infrared signal.

In this example, the internal bearing sections 12 of the capsule 5 are preferably positioned at the repetition pitch of the detectors, in the two dimensions of the matrix of detectors. The shape of the bearing sections 12 is essentially linear and those that are colinear with the insulating arms 11b are advantageously arranged between the arms of the detectors 2 of a given row. Positioning the bearing sections along two axes is of a nature to reinforce the adherence of the capsule to the substrate.

Advantageously, internal bearing sections 12 may also be produced between the edge detectors and the peripheral wall 6a of the capsule 5. These additional bearing sections essentially have the function of recreating, for the edge detectors, an environment (especially from an optical point of view) comparable to that of core detectors. Another way of decreasing these edge effects would be to provide, on the periphery of the matrix, rings of dummy detectors that would not contribute to the video signal of the matrix-array device. Rings of one to a few, typically two, detectors satisfactorily provide this function.

Figure 11:
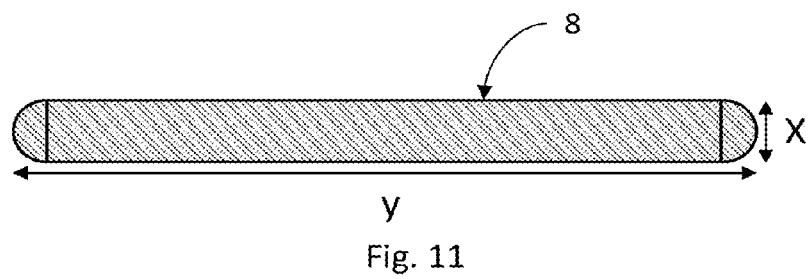
FIG. 11 is a schematic representation of a top view of an exhaust vent according to another embodiment, in which the vent has a oblong-shaped profile with rounded ends.

According to one embodiment shown in FIG. 11, the profile of the exhaust vents 8, in a plane parallel to the plane of the substrate, has an oblong, i.e. elongate, shape. Its small dimension X, measured in the direction of the width of the vent, is chosen so as to ensure effective sealing of the vent, and its large dimension Y, measured in the direction of the length of the vent, may be adjusted to facilitate the transit of reactive species and reaction products of the etching of the material of the sacrificial layers 15, 16 during removal, thereby allowing the time taken to remove the sacrificial layers to be optimised. In this respect, the width X may typically be comprised between about 150 nm and 600 nm, whereas the large dimension Y may be about a few microns, 5 μm for example.

Advantageously, the vents 8 have an oblong shape with rounded longitudinal ends. By way of example, the rounded shape of an end may have a radius of curvature equal to half the width X of the vent. More generally, it may correspond to a continuous, circular or elliptical, curved shape, such as in the example in FIG. 11, or to a succession of right or substantially curved segments. The inventors have shown that this vent shape makes it possible to avoid the risk of cracks initiating in the thin encapsulating layer 6 and propagating into the sealing layer 7. Specifically, it is essential to prevent any risk of cracks that are liable to break the hermeticity of the cavity, in so far as a local hermeticity flaw could lead to operational failure of the entire device.

Figure 12:
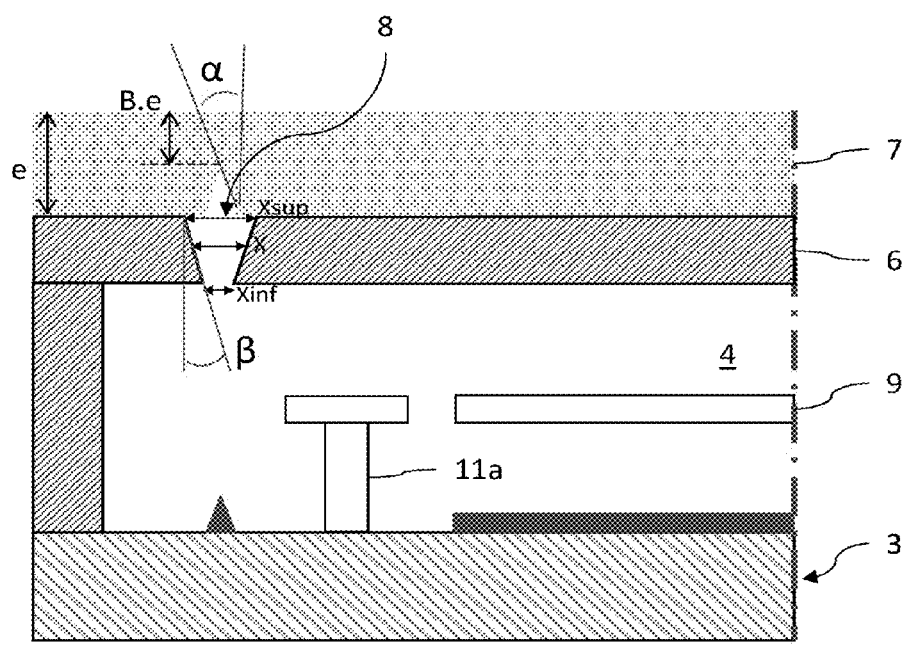
FIG. 12 is a partial cross-sectional view of a portion of a detecting device according to one embodiment.

As FIG. 12 shows, the inventors have observed that the sealing layer 7, bordering the vents 8, has a tendency to extend vertically, i.e. in the direction of the thickness of the layer 7, with a non-zero angle α relative to the normal, i.e. relative to an axis orthogonal to the plane of the substrate, in particular when a vacuum thin-film deposition technique, such as low-pressure sputtering or evaporation, is used. The average width X of the vents may be chosen depending on the thickness e of the deposited sealing layer 7, on the fractional thickness B of the sealing layer actually ensuring the hermeticity, and on the growth angle α, from the following relationship:

$$X = 2 \cdot e(1-B) \cdot \tan(\alpha)$$

By way of example, when an evaporation technique is used to deposit the sealing layer, the angle α is typically about 15° to 20°. For a thickness e of sealing layer of 1800 nm, and if it is desired for 1200 nm of layer to ensure the hermeticity (B=⅔), an average vent width X of about 320 nm to 410 nm is obtained.

Moreover, it is advantageous for the exhaust vent 8 to have a cross section, in a plane orthogonal to that of the substrate, that has a shape the aperture of which increases in size with distance from the substrate 3. In other words, the vent 8 has a transverse profile that is flared towards the exterior of the cavity. It is narrower level with its bottom orifice opening onto the cavity and wider level with its top orifice opening outside of the cavity. By way of example, the width $X_{inf}$ level with the bottom orifice may be about 100 nm to 350 nm whereas the width $X_{sup}$ level with the top orifice may be about 250 nm to 800 nm. In this example, the thin encapsulating layer 6 has a thickness of about 800 nm. It results from this shape of the cross section of the vent 8 that the quality of the seal sealing the vent is improved. More precisely, for a given thickness e of sealing layer, the inventors have observed that the fraction B of layer that actually provides the seal is larger in the case where the vent has a right cross section, thereby improving the quality of the seal.

Such a vent cross section may be obtained by generating a slope in the flanks of the resist before etching of the vent, either by post-development reflow or by modifying the conditions of exposure and/or development of the resist (exposure dose, focus, temperature and duration of post-exposure anneals) as is known by those skilled in the art. Such a vent cross section may also be obtained during the dry etching of the vent by adding an isotropic component to the etching, for example by adding oxygen to the chemistry used to etch the vent. In the case where the thin encapsulating layer 6 is made of silicon, the addition of fluorine-containing gases, such as $SF_6$ or $CF_4$, to the etch chemistry will also contribute to increasing the isotropic component of the etching.

The beneficial effect of this particular vent profile especially manifests itself when the angle β that the profile of the vent makes to the normal to the substrate is larger than the angle α defined above. By way of example, for a thin encapsulating layer thickness of 800 nm and for a bottom orifice width $X_{inf}$ of 100 nm, the top orifice width $X_{sup}$ may be larger than 530 nm ($\beta=15°$), or even larger than 680 nm ($\beta=20°$). In the embodiment in FIG. 12, the vent 8 is placed on the border of the cavity 4 but it could be located at other cavity locations.

Figure 13:
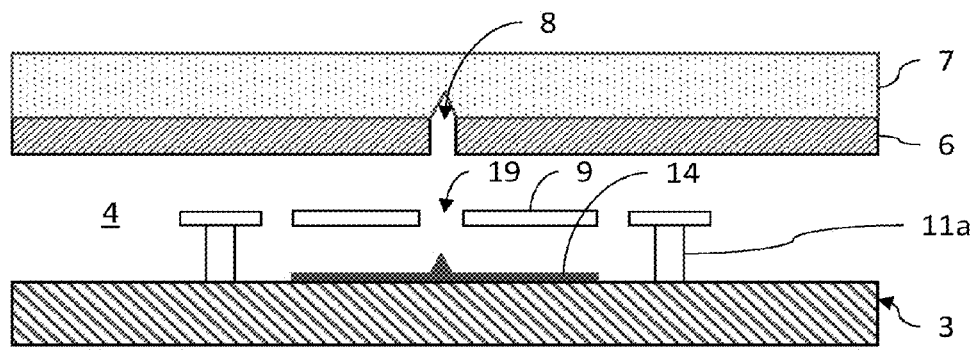
FIG. 13 is a cross-sectional schematic view of a detecting device according to one embodiment, in which a single exhaust vent per detector is placed facing the suspended membrane and in which the membrane includes a through-orifice located plumb with the exhaust vent.

In this respect, according to one embodiment illustrated in FIG. 13, the thin encapsulating layer 6 includes at least one exhaust vent 8 placed so that at least one thermal detector 2 present in the cavity 4 has a single exhaust vent 8 located facing its absorbing membrane 9, preferably plumb with the centre of the absorbing membrane 9. In other words, the single vent 8 is located plumb with the absorbing membrane 9, i.e. perpendicular to the absorbing membrane 9. The single vent 8 is therefore not located facing anchoring pins 11a or thermally insulating arms 11b.

Thus, production of the vent is simplified by its distance from the zones of high topography that are the trenches, thereby allowing a good dimensional control of the shape of the vent to be obtained. In addition, the inventors have observed that positioning a single vent facing the absorbing membrane of the thermal detector makes it possible to avoid, after removal of the sacrificial layers, the presence of sacrificial layer residues attached to the membrane. The presence of these residues has especially been observed when at least two vents per detector are placed on either side of the membrane. The residues are generally located in a zone equidistant from the various vents, the suspended membrane being located in said zone. They may modify the optical and/or electrical and/or thermal properties of the membrane (for example by increasing the mass of the membrane, thereby decreasing the response time of the detector), or even modify the residual pressure level under the effect of gradual degassing. In addition, the step of removing the sacrificial layers is optimised, especially in terms of the time taken to remove the sacrificial layers, by way of a combined effect of the oblong shape of the vent and the central position thereof with respect to the detector.

In the case where the cavity 4 houses a single thermal detector 2, the thin encapsulating layer 6 then comprises a single exhaust vent 8 located facing the absorbing membrane 9 of the thermal detector. In general, the detecting device includes a matrix of thermal detectors 2 in which each detector is encapsulated in a single cavity. The encapsulating structure then includes a matrix of cavities all formed by the same thin encapsulating layer. Level with each cavity, the thin encapsulating layer includes a single exhaust vent placed facing the absorbing membrane of the detector housed in the cavity.

In the case where the cavity 4 houses a plurality of thermal detectors 2, the thin encapsulating layer then includes at least one exhaust vent and preferably a plurality of exhaust vents placed so that at least some of said thermal detectors 2 each has a single exhaust vent 8 located facing the corresponding absorbing membrane 9. Each thermal detector of the matrix may have a single vent placed facing the corresponding absorbing membrane. Alternatively, only some of the thermal detectors may each have a single exhaust vent located facing the corresponding membrane. It is then advantageous, for a row or a column of thermal detectors, for the exhaust vents to be placed above every Nth uneven detector. This makes it possible to avoid the presence of sacrificial layer residues on the absorbing membrane of a detector not provided with an exhaust vent. By way of example, in the case where N=3, two neighbouring detectors not provided with an exhaust vent are placed between two detectors each provided with a single exhaust vent. In this example, none of the thermal detectors, whether they are or are not provided with an exhaust vent, will see their absorbing membrane degraded by the presence of sacrificial layer residues. This variant embodiment is particularly advantageous in the case of small matrix pitches, for example when the positional pitch of the detectors is about 12 µm or less.

It is then advantageous to provide a through-orifice 19 in the membrane 9 of the detector, located plumb with the corresponding vent 8, and the size of which is equal to or larger than the size of the vent 8, so as to achieve a margin of safety allowing for possible misalignment of the vent and/or orifice of the membrane, which may be about 200 nm to 500 nm. Thus, during the deposition of the sealing layer, a section of the sealing material that is liable to fall through the vent will not be deposited on the membrane but will instead pass through the orifice of the membrane and be deposited on the substrate.

It is then advantageous to provide (on the substrate) a tie layer, under the membrane 9, in line with the through-orifice 19, in order to ensure the fallen sealing agglomerate, if there is one, remains held in place. Advantageously, this tie layer may be a section of the aforementioned tie layer 14, the material of which is then suitable for furthermore ensuring the attachment of the sealing material. Thus, in the step of sealing the cavity, in the case where a quantity of sealing layer material passes through the vent, said quantity will deposit on and adhere to the tie layer. This especially makes it possible to relax constraints on the type of material present on the surface of the substrate, and more precisely on the material used to passivate the top side of the substrate.

This tie layer 14 may extend, continuously or discontinuously, over various zones of the cavity, and more precisely: under the membrane 9 and facing its through-orifice 19, in order to ensure attachment of the sealing material liable to fall through the vent 8; under the entirety of the membrane 9 in order to provide an optical function enabling reflection of the radiation to be detected; level with the various trenches 17, 18 in order to protect the substrate 3 during the etching step used to form the trenches and to improve the attachment of the thin encapsulating layer 6 to the substrate; and level with the anchoring pins 11a in order to improve the attachment of the pins to the substrate and improve the electrical conduction between the pins and the read circuit placed in the substrate. The thickness of this tie layer is preferably constant over its entire extent, and especially in the various aforementioned zones. This tie layer may be made of chromium or titanium, aluminium or titanium nitride or of another suitable material and optionally takes the form of a stack of sublayers made from the aforementioned materials, and have a thickness of about 100 nm to 400 nm.

Figure 14:
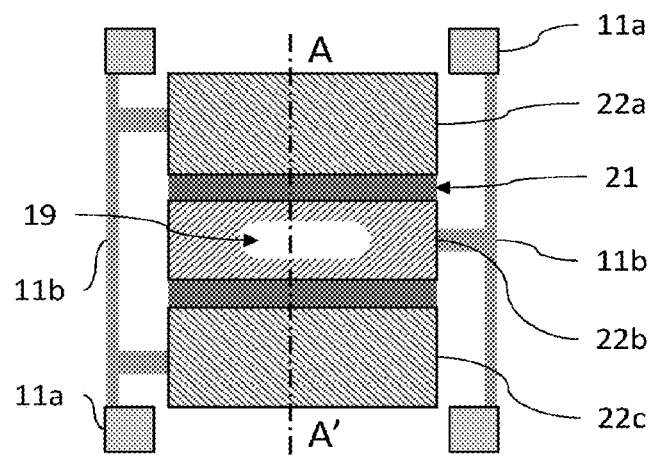
FIGS. 14 and 15 are schematic views of a detecting device according to another embodiment, in which the suspended membrane includes an intermediate dielectric layer.
Figure 15:
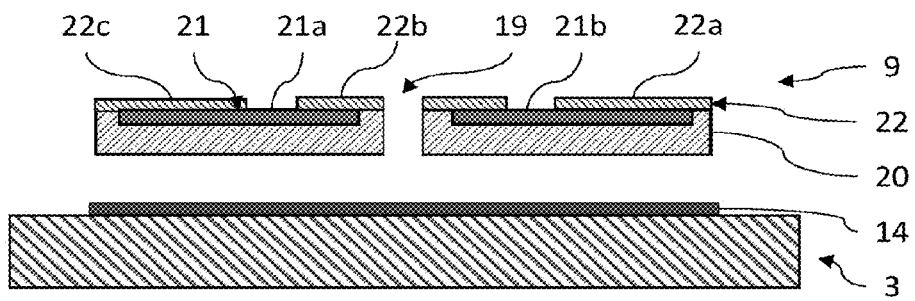

According to one embodiment shown in FIGS. 14 and 15, the detectors 2 the membrane 9 of which includes a through-orifice 19 have a membrane architecture with an intermediate electrical insulation, such as described in document EP1067372.

FIG. 14 is a top view of an absorbing membrane 9 of a bolometric detector with this type of architecture. The absorbing membrane 9 is connected to four anchoring pins 11a and is suspended by way of two thermally insulating arms 11b. FIG. 15 is a cross-sectional view in the plane A-A in FIG. 14.

The membrane 9 includes a layer of a bolometric (and therefore resistive) material 20, for example doped amorphous silicon or vanadium oxide. It also includes a layer of a dielectric material 20 that is placed on the bolometric layer 20 and that covers the latter in two separate zones 21a, 21b.

It also includes a layer of an electrically conductive material 22, which layer is deposited on the dielectric layer 21 and the bolometric layer 20 and locally etched over the entire width of the membrane as far as the dielectric layer, so as to form three separate conductive sections 22a, 22b, 22c. The conductive layer 22 extends onto the insulating arms 11b in order to electrically connect the three sections 22a, 22b, 22c to the read circuit. Among the three conductive sections, the two sections 22a, 22c that are located at the ends of the membrane 9 are electrically connected to two portions of the same insulating arm 11b and thus form two electrodes intended to be raised to the same electrical potential. These two end sections 22a, 22c flank a central portion 22b connected to another insulating arm that forms an electrode intended to be raised to another electrical potential.

The dielectric layer 21 is etched so that each electrode 22a, 22b, 22c makes electrical contact with the bolometric material 20 and so that the end electrodes 22a, 22c are electrically insulated from the central electrode 22b.

In this embodiment, the absorbing membrane 9 includes a through-orifice 19, here of oblong profile, placed at the centre of the central electrode 22b. Preferably, the orifice 19 is placed level with where the dielectric layer 21 is etched. The orifice 19 thus only passes through the central electrode 22b and the bolometric layer 20. Preferably, the distance, measured in the direction of the width of the orifice 19, between the border of the orifice and the border of the dielectric layer 21, facing the orifice, is larger than or equal to the thickness of the bolometric layer 20 making contact with the central electrode 22b in this zone. Any influence the orifice might have on the electrical properties of the absorbing membrane is minimised or even suppressed by positioning the orifice in this way.

The example described with reference to FIGS. 14 and 15 shows a bolometric layer 20 in the bottom portion of the membrane 9, on which the dielectric layer 21 and the electrodes 22a, 22b, 22c rest. However, an inverted arrangement of the layers is also producible, in which the electrodes 22a, 22b, 22c are located in the bottom portion of the membrane 9, on which electrodes rest the dielectric layer 21 then the bolometric layer 20.

The invention claimed is:

1. A device for detecting electromagnetic radiation, comprising:
    a substrate;
    at least one thermal detector placed on the substrate; and
    an encapsulating stricture encapsulating the thermal detector, including a thin encapsulating layer extending around and above the detector so as to define with the substrate a cavity in which the thermal detector is disposed, said thin encapsulating layer being produced from a material that is transparent to said electromagnetic radiation,
    wherein the thin encapsulating layer comprises a peripheral wall that encircles the thermal detector, and that has a cross section, in a plane parallel to a plane of the substrate, of square or rectangular shape, corners of which are rounded.

2. The detecting device according to claim 1, wherein the peripheral wall includes a rounded section and two rectilinear sections extending along, axes that are substantially orthogonal to each other, said rectilinear sections being connected to each other by the rounded section, the rounded section having a radius of curvature larger than or equal to two times a thickness of one of the rectilinear sections.

3. The detecting device according to claim 2, wherein the radius of curvature of the rounded section is measured from an internal surface of the rounded section that is oriented towards the cavity.

4. The detecting device according to claim 1,
    wherein the thin encapsulating layer includes at least one through-orifice that is an exhaust vent, and
    wherein the encapsulating structure further includes a sealing layer covering the thin encapsulating layer so as to make the cavity hermetic.

5. The detecting device according to claim 1, further comprising a matrix of detectors disposed in the cavity, in which the thin encapsulating layer further includes at least one section that is an internal bearing section, disposed between two adjacent detectors, and that bears directly against the substrate.

6. The detecting device according to claim 5, wherein the internal bearing section has a profile of oblong shape in a plane parallel to a plane of the substrate, with rounded longitudinal ends.

7. The detecting device according to claim 6, wherein the internal bearing section includes a sidewall portion and a bottom portion, the sidewall portion extending substantially vertically over an entire height of the cavity and the bottom portion contacting the substrate.

8. The detecting device according to claim 1, further comprising a matrix of thermal detectors, each detector of said matrix including a membrane configured to absorb the radiation to be detected, the membrane being suspended above the substrate and then sally insulated therefrom by anchoring pins and thermally insulating arms, the thin encapsulating layer including a plurality of through-orifices that are exhaust vents disposed so that at least some of said thermal detectors each have a single exhaust vent disposed facing a corresponding absorbing membrane and being plumb with a center of said membrane.

9. The detecting device according to claim 8, wherein said membrane faces an exhaust vent and includes a through-orifice disposed plumb with said exhaust vent and being of larger or equal size to that of said exhaust vent.

10. The detecting device according to claim 9, Wherein said membrane includes a stack of a bolometric layer, a dielectric layer that is structured so as to form two separate sections, and an electrically conductive layer that is structured so as to form three electrodes, two of said electrodes, which are configured to be raised to a same electrical potential, flanking a third of said electrodes being a central electrode and which is configured to be raised to a different electrical potential, each electrode of said three electrodes contacting the bolometric layer, the central electrode being electrically insulated from the other two of said electrodes by the dielectric layer, the through-orifice passing through the central electrode and the bolometric layer in a zone disposed between the two separate Sections of the dielectric layer.

11. The detecting device according to claim 10,
    wherein the encapsulating structure further includes a sealing layer covering the thin encapsulating layer so as to make the cavity hermetic, and
    wherein the substrate comprises a tie layer disposed facing the through-orifice of a corresponding membrane and configured to ensure adhesion of a material of the sealing layer.

12. The detecting device according to claim 11, wherein the tie layer extends under a whole of the corresponding membrane and is made of a material configured to reflect the electromagnetic radiation to be detected.

13. A process for producing a detecting device for detecting electromagnetic radiation, the detecting device comprising:
- a substrate,
- at least one thermal detector placed on the substrate, and
- an encapsulating structure encapsulating the thermal detector, including a thin encapsulating layer extending around and above the detector so as to define with the substrate a cavity in which the thermal detector is disposed, said thin encapsulating layer being produced from a material that is transparent to said electromagnetic radiation,
- wherein the thin encapsulating layer comprises a peripheral wall that encircles the thermal detector, and that has a cross section, in a plane parallel to a plane of the substrate, of square or rectangular shape, corners of which are rounded; and the process comprising:
- placing the thin encapsulating layer on a sacrificial layer, and then
- removing the sacrificial layer and extracting the sacrificial layer through at least one exhaust vent in the thin encapsulating layer.

* * * * *

UNITED STATES PATENT AND TRADEMARK OFFICE
CERTIFICATE OF CORRECTION

Page 1 of 1

PATENT NO. : 9,831,371 B2
APPLICATION NO. : 15/048177
DATED : November 28, 2017
INVENTOR(S) : Geoffroy Dumont et al.

It is certified that error appears in the above-identified patent and that said Letters Patent is hereby corrected as shown below:

In the Claims

Column 15, Line 63, Claim 2, "along,axes" should read as "along axes"

Column 16, Line 30, Claim 8, "then sally" should read as "thermally"

Column 16, Line 41, Claim 10, "Wherein" should read as "wherein"

Signed and Sealed this
Twenty-eighth Day of May, 2019

Andrei Iancu
*Director of the United States Patent and Trademark Office*